United States Patent [19]

Craven

[11] 4,141,004
[45] Feb. 20, 1979

[54] SOLID STATE DIGITAL TO ANALOG CONVERTER

[75] Inventor: Robert B. Craven, Wayland, Mass.

[73] Assignee: Analog Devices, Incorporated, Norwood, Mass.

[21] Appl. No.: 651,728

[22] Filed: Jan. 23, 1976

Related U.S. Application Data

[62] Division of Ser. No. 505,477, Sep. 12, 1974, Pat. No. 3,961,326.

[51] Int. Cl.² .................. H03K 13/04; H03K 17/56
[52] U.S. Cl. .................. 340/347 DA; 307/241; 340/347 M
[58] Field of Search .................. 340/347 DA, 347 M; 307/241–244

[56] References Cited
U.S. PATENT DOCUMENTS 3,940,760  2/1976  Brokaw .................. 340/347 DA Primary Examiner—Thomas J. Sloyan
Attorney, Agent, or Firm—Parmelee, Johnson, Bollinger & Bramblett

[57] ABSTRACT

An integrated-circuit 12-bit digital-to-analog converter comprising binarily-scaled constant-current sources with associated switch cells employing bipolar transistors to direct the bit currents either to a summing bus or to ground. The switch cells include a first differential transistor pair to translate a single-ended binary logic signal to double-ended (balanced) format, and a second, fully-balanced differential pair operated by the balanced logic signal to direct the bit current correspondingly. A bias-generating circuit maintains a constant collector-base voltage at the constant-current source. The threshold voltage for the logic signals can be set for TTL logic or, by pin-programming, for CMOS logic of either low-voltage or high-voltage type.

7 Claims, 2 Drawing Figures

SOLID STATE DIGITAL TO ANALOG CONVERTER

This is a division of application Ser. No. 505,477 filed Sept. 12, 1974, now U.S. Pat. No. 3,961,326.

BACKGROUND OF THE INVENTION

1. Field of the Invention

This invention relates to digital-to-analog converters. More particularly, this invention relates to such converters provided in integrated-circuit (IC) format on monolithic chips.

2. Description of the Prior Art

Digital-to-analog converters generally have comprised a plurality of switches which are selectively operated by an input digital signal to produce corresponding binarily-weighted contributions to an analog output signal. For solid-state converters, it was found that current switches were superior to voltage switches, and an excellent example of such a design, using discrete elements, is shown in U.S. Pat. No. 3,685,045. That patent also discloses the important concept of providing a matched reference transistor, in combination with means for automatically adjusting the power supply voltage so as to maintain the reference transistor current constant, thereby also maintaining the switch currents constant.

Considerable effort has been devoted to applying integrated-circuit techniques to digital-to-analog converters. However, difficult problems have been encountered, particularly in converters designed to handle relatively large digital numbers, e.g. upwards of 8 bits. One significant advance in that regard (see U.S. Pat. No. 3,747,088) was to divide the switches into separate but identical groups, and to provide attenuation means to reduce the current contributions of the groups representing lower-order bit. For example, a 12-bit converter can be formed of three separate IC switch modules each containing four switches (such modules now being commonly referred to as "quad switches"). The latter '088 patent also teaches the highly advantageous concept of binarily scaling the areas of the emitters of the constant-current transistors, so as to provide uniform current density within the conductive regions of the transistors, thereby minimizing any differential variations in $V_{BE}$ of the current switches.

Notwithstanding such developments in the design of solid-state digital-to-analog converters, there still has existed a need for improved integrated-circuit converters capable of handling relatively large digital numbers. It particularly has been desired to provide improved operational characteristics, e.g. accuracy and speed. Also, there has been a need for IC converters capable of performing a multiplier function with accuracy. And such improved performance converters particularly should be capable of being manufactured at reasonable cost, using straightforward IC processing techniques.

SUMMARY OF THE INVENTION

In a preferred embodiment of the invention, to be described hereinbelow in detail, there is provided an IC digital-to-analog converter capable of handling 12-bit inputs with superior operating characteristics. This converter includes 12 high-performance current switches, all formed on a single chip. Each current switch is a precision multi-element cell structure comprising standard bipolar transistors arranged with a unique cooperative relationship resulting in excellent switching performance. A bias-voltage generator circuit is provided for all of the switch cells, to aid in rejecting the effects of supply voltage variations, and to enhance the capabilities of the converter as a multiplier. Special logic-threshold-setting circuitry also is incorporated to permit the converter to be pin-programmed for use with either conventional TTL logic inputs, or with CMOS logic inputs of either low-voltage or high-voltage range; the positive supply voltage can be set at any value over a relatively wide range of values without degrading the converter accuracy.

Accordingly, it is a principal object of this invention to provide improved digital-to-analog converter apparatus of the integrated-circuit (IC) type. A more specific object of this invention is to provide such a converter which is capable of handling large digital numbers with superior operating characteristics, and yet is able to be manufactured at reasonable cost. Still other objects, aspects, and advantages of the invention will in part be pointed out in, and in part apparent from, the following description considered together with the accompanying drawings.

DESCRIPTION OF THE PREFERRED EMBODIMENT

Figure 1:
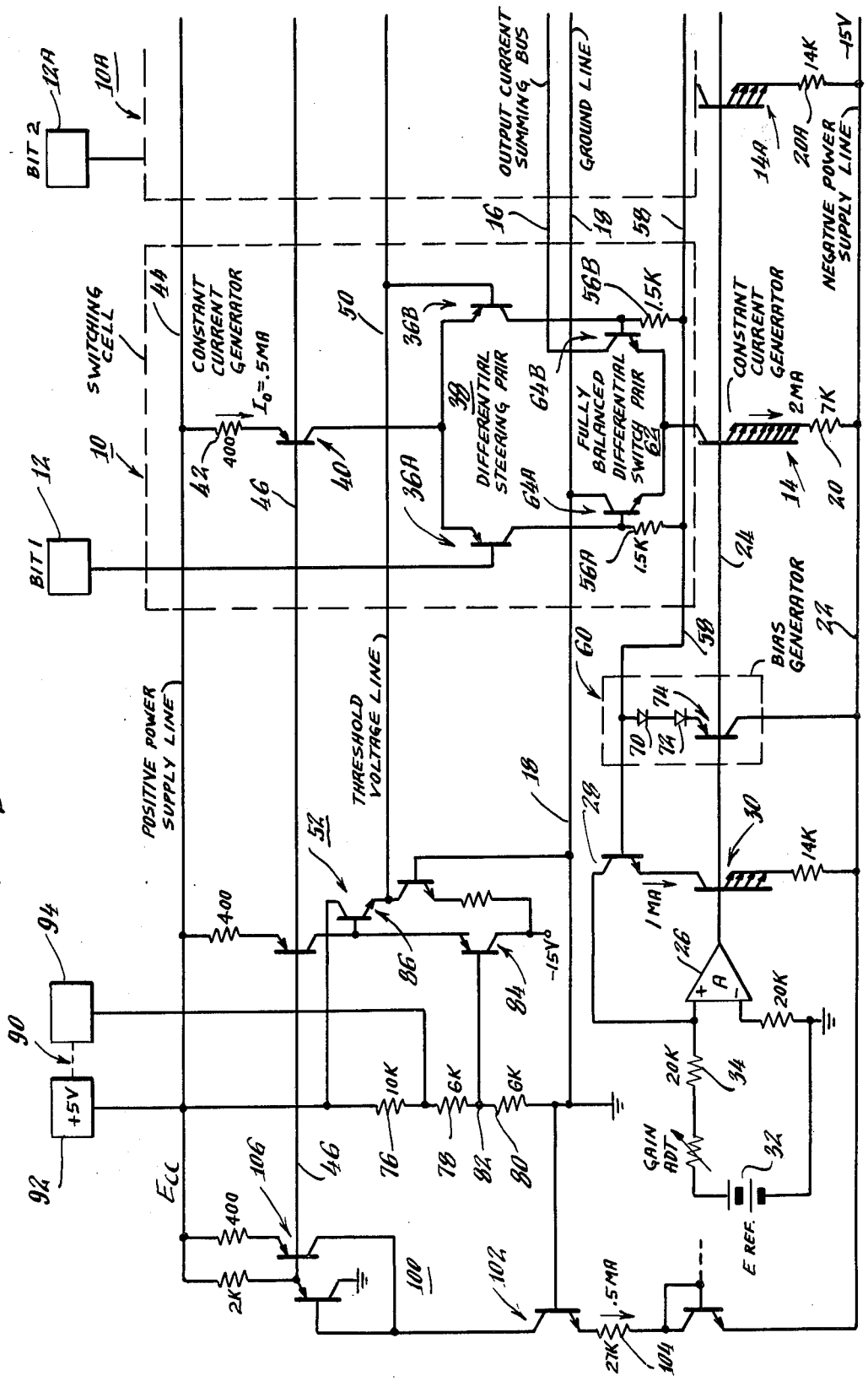
FIG. 1 is a schematic diagram of a preferred converter design, showing details of one switch cell and its relationship to other components of the converter.

Referring now to FIG. 1, a converter in accordance with this invention comprises a plurality of selectively-operable, identical switching cells 10 (only one of which is shown in detail), controllable by digital logic signals applied to respective logic signal input terminals 12. Each switching cell is arranged to switch the current flowing through a corresponding constant-current generator 14, alternatively between (1) an output current summing bus 16 and (2) a ground line 18. These constant-current generators 14 comprise NPN transistors with their emitters connected through respective current-setting resistors 20 to the negative power supply line 22. The resistor values are binarily-scaled to provide binarily-weighted currents through the respective transistors 14.

The areas of the emitters are also binarily-scaled to provide uniform current density in all of the constant-current transistors 14, thereby providing uniform $V_{BE}$ for all such transistors and minimizing the effects both of differential variations in current levels and differential temperature coefficients of these current levels attributable to $V_{BE}$ mismatch. The bases of all the constant-current transistors are connected together and driven from a common base line 24 connected to the output of an operational amplifier 26. This amplifier compares the current through a series-connected pair of reference transistors 28, 30 with a constant reference current developed by a reference voltage source 32 and a reference resistor 34, and continuously adjusts the base voltage of the reference transistor 30 to maintain the current through that transistor constant. This voltage control similarly maintains the current through all of the constant-current transistors 14 fixed, as explained in the above-mentioned U.S. Pat. Nos. 3,685,045 and 3,747,088.

Turning now to the switch cell structure 10 in detail, the logic signal from input terminal 12 is directed to the base of a PNP transistor 36A which cooperates with a matched transistor 36B to form a first differential pair 38. (In the description herein, the term "differential pair" is to be understood as meaning a two-transistor circuit arrangement wherein the two transistors are alternatively conductive, i.e. either one or the other is conductive, depending upon the state of an input signal to the differential pair.) The emitters of these transistors 36A, 36B are connected together and to the collector of an NPN transistor 40 connected as a constant-current source producing a current $I_o$ of 0.5 ma. A current-setting resistor 42 is connected between the emitter and the positive supply voltage line 44, and the base is connected to a common base line 46 held at the required voltage to maintain 0.5 ma from the source 40.

The base of transistor 36B is connected to a threshold voltage line 50 which carries a fixed voltage developed by a threshold voltage control circuit 52, to be described subsequently. When the conventional TTL-type logic circuitry is used to produce the logic signals for the input terminals 12, line 50 will be held at approximately 1.4 volts. If, now, the applied logic signal at the base of transistor 36A is $\leq +0.8$ volts (indicating a TTL logical "0"), the constant current $I_o$ flows through that transistor 36A. The emitter potential under those conditions will be one-diode drop above the logic signal level, i.e. $\leq + 1.5$ volts, and thus there will be no conduction through the other transistor 36B. If, now, a logical "1" signal $\geq + 2.0$ volts is applied to terminal 12, the emitter potential will rise, and the constant source current $I_o$ now will flow through the other transistor 36B. The emitter potential in that case will be one diode-drop above the threshold base potential of 1.4 volts, i.e. 2.1 volts, and thus there can be no conduction through the first transistor 36A.

The collectors of transistors 36A, 36B are connected through respective identical resistors 56A, 56B to a bias-voltage line 58 the voltage of which is maintained substantially constant by a bias-generating circuit generally indicated at 60, and which will be described subsequently. The upper terminals of resistors 56A, 56B are connected respectively to the bases of a second differential pair 62 of matched transistors 64A, 64B. This second pair is formed with NPN transistors, and the emitters are connected together to the collector of the constant-current generator 14 previously discussed.

This second pair 62 is a fully-balanced differential-pair, which in the context of the present invention means that the input circuits for the two transistors 64A, 64B are identical and function in exactly the same way to render the respective transistors alternatively conductive. Thus the input circuits are arranged to provide oppositely-symmetrical operating signals for controlling the two transistors. Oppositely-symmetrical in this context means that when one operating signal is high, the other is low, and vice-versa, and that the two high signals are equal and the two low signals are equal.

When the bit input is a logic "0" at terminal 12, and the first transistor 36A is conductive, $I_o$ flows through resistor 56A and thereby elevates the base potential of transistor 64A to approximately one-diode drop (about 0.7 volts) above the bias line 58. Since no current flows through the other resistor 56B, the base of transistor 64B will be held at the bias potential of line 58. Under these circumstances, transistor 64B will be non-conducting, and transistor 64A will be rendered conductive to carry current from ground line 18 through to the constant-current generator 14. Alternatively, if the input is a logical "1" at terminal 12, transistor 36B will conduct $I_o$ therethrough to resistor 56B which will accordingly render transistor 64B conductive while the other transistor 64A is non-conducting. Under those conditions, the current of the constant-current generator 14 will flow through the output current summing bus 18 connected to the collector of transistor 64B.

Since the transistor pair 62 is fully balanced, the potential of the connected emitters will not undergo any significant change when the pair switches differentially between the two alternative states of operation. More specifically, the emitter potential will be held at one diode-drop below the base potential of the conducting transistor, and the base potential of that conducting transistor will be approximately one diode-drop above the bias line 58. Thus, the potential of the emitters of the second differential pair 62 will remain effectively at the constant potential of the bias line 58, as the pair switches between its alternative states.

Accordingly, with a substantially unchanging emitter potential, the switching delay associated with the time required to charge an emitter transition capacitance is thus eliminated, thereby providing an important advance over prior art switches using conventional single-ended arrangements. Also of considerable importance is the fact that the switching speed of the cell is nearly independent of the value of current being switched, since reliable switching can be achieved with only a single diode-drop change in emitter-base voltage at each switch transistor 64A, 64B. This achievement can be contrasted with commonly-used converters wherein the switching time for the lower bit currents is significantly greater than for the higher bit currents. The constant-speed switching-characteristic of the inventive embodiment disclosed herein is particularly valuable in achieving accurate performance when the converter is operated as a multiplier.

It should further be noted that since the emitters of transistors 64A, 64B have the same potential for either of the two alternative switch states, the potential of the collector of the constant-current source transistor 14 likewise will have the same potential for either switch state. Thus, there is no differential power change in these transistors as the various bit combinations are switched. This reduces non-linearity and thermal transient errors caused by differential heating effects.

The current $I_o$ from resistors 56A, 56B flows down through the previously-mentioned bias-generating circuit 60 which in the preferred embodiment consists of a pair of series-connected diodes 70, 72 and a PNP transistor 74. The base of transistor 74 is connected to the controlled base line 24 driven by amplifier 26, and the collector is returned to the negative power line 22. With this arrangement it will be seen that the bias line 58 is held at 3 diode-drops above the base line 24. In effect, this bias voltage serves as a common-mode signal to both of the inputs of the differential switch pair 62, to be combined with the balanced but oppositely-symmetrical signals resulting from the flow of $I_o$ alternatively through resistor 56A or resistor 56B.

With $I_o$ of 0.5 ma flowing through either resistor 56A or 56B (both of 1.5 K ohms), the base voltage of the conducting transistor 64A, 64B will be approximately one diode-drop above the bias line 58. The emitter of the conducting transistor will, in turn, be one diode-drop below the base voltage. Since the transistor emitters both are connected to the collector of the constant-current generator transistor 14, the collector of that transistor 14 will be maintained at substantially the potential of the bias line 58. Thus, the collector-base voltage of transistor 14 will be maintained at a 3 diode-drop differential regardless of changes in the supply voltage, or of changes in the reference voltage 32.

This bias-circuit arrangement prevents $h_{RE}$ effects from causing changes in the collector current of transistor 14 due to variations in supply or reference voltage. Such voltage variations appear across the collector-base electrodes of the differential switch pair 62, but do not have any significant effect on the collector currents of transistors 64A, 64B because both of those transistors are operated with a constant-current source in their emitter circuits. Thus, this bias-circuit arrangement provides excellent rejection of power supply variations.

As noted previously, when the converter is used with standard TTL logic, the threshold voltage line 50 is maintained at + 1.4 volts with respect to the ground line by the threshold voltage control circuit 52. This circuit comprises a set of three resistors 76, 78, 80 connected in series between the positive voltage line 44 and the ground line 18. With a + 5-volt power supply, and resistance values as shown, the junction 82 between the lower two resistors 78, 80 will be at approximately + 1.4 volts. This voltage is applied to the base of a conducting PNP transistor 84 the emitter of which will be at a potential one diode-drop higher than its base, i.e. approximately + 2.1 volts. This emitter in turn is connected to the base of a conducting NPN transistor 86, the emitter potential of which will be one diode-drop below its base, i.e. approximately + 1.4 volts. This emitter is connected to the threshold voltage line 50, to direct the threshold voltage to the switching cells as described hereinabove.

In accordance with another aspect of the present invention, the converter is provided with facilities to permit operation, selectively, with either TTL or CMOS logic signals. As noted above, TTL logic signals require a threshold voltage of + 1.4 volts. However, when CMOS logic inputs are employed, the threshold should be set at the optimum value of one-half of the positive power supply voltage. Moreover, at the present time there are in use two different categories of CMOS logic, one of which operates at a low power supply voltage, e.g. around 5 volts, and the other of which operates at a considerably higher voltage, such as around 12 volts. Either of these categories can be accommodated by the converter described herein.

In more detail, for operation with CMOS logic, the user merely connects a jumper 90 between the positive supply voltage pin 92 and an adjoining pin 94. This jumper connection shorts out resistor 76, so that the voltage at junction 82 will be determined by the voltage-dividing action of the two remaining equal-value resistors 78, 80. Thus, the voltage applied to the base of transistor 84 will, under these circumstances, always be equal to ½ of the positive power supply voltage ($E_{cc}$). As noted hereinabove, this voltage, after translation through transistors 84 and 86, appears on the threshold voltage line 50. Accordingly, whatever value of $E_{cc}$ is selected for the particular CMOS logic being used, the threshold voltage will be automatically set at the required level of ½ $E_{cc}$. This result, moreover, is achieved in very simple fashion by the converter user, by means of pin-programming.

In order to assure proper operation of the converter over the relatively wide range of $E_{cc}$ values which might be selected, the current source 40 is a constant-current generator, providing a constant output $I_o$ of 0.5 ma for the desired range of supply voltage. The base voltage line 46 for this source 40 is automatically set by a control circuit 100 which includes a constant-current source 102 connected between ground and the negative supply voltage (−15 V.). This source 102 includes an emitter resistor 104 arranged to set the current level at 0.5 ma. The source 102 is connected in series with another current source 106 which is energized by the positive voltage supply, and is matched to the switching-cell current source 40, with both sources 40 and 106 being driven by a common base line 46. The base voltage of source 106 is automatically maintained at the value required to produce 0.5 ma through that source, because the source current of 0.5 ma is fixed by source 102. Thus, the bases of all of the switching-cell constant-current sources 40 will be maintained at the value required to produce 0.5 ma from those sources. The circuit disclosed herein is designed to provide for proper operation of the converter over an $E_{cc}$ range from + 4.75 to + 15.8 volts.

Figure 2:
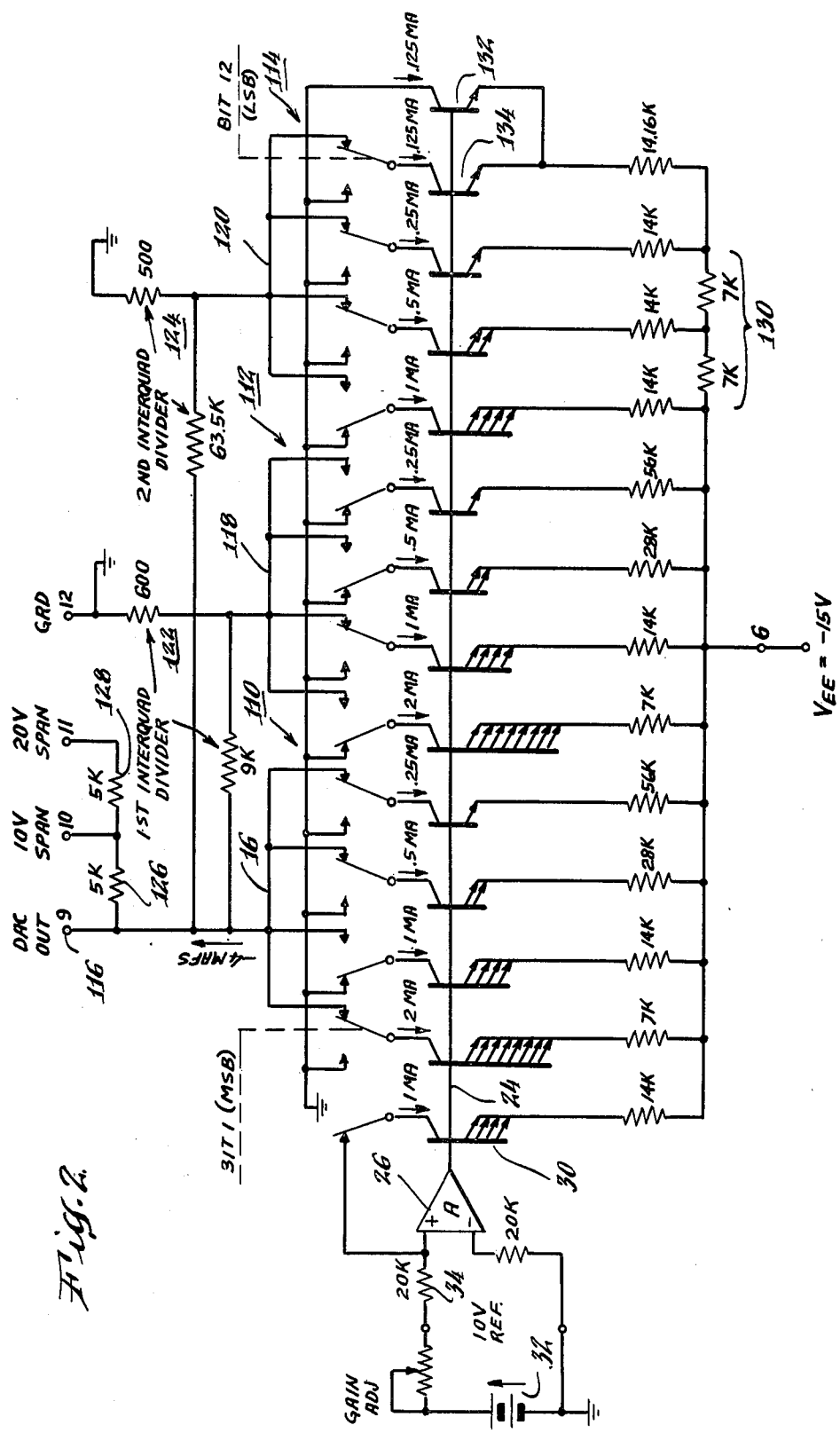
FIG. 2 is a schematic diagram illustrating the overall arrangement of the converter.

The overall converter arrangement is shown in outline form in FIG. 2. Here it is seen that the converter has a digital capacity of 12 bits, divided into three separate 4-bit groups of switches 110, 112, 114. The current summing bus 16 of the first group goes directly to the output terminal 116. The other two summing buses 118, 120 are connected through respective attenuation networks 122, 124 to the output terminal. These networks give attenuations of 16:1 and 128:1, respectively. Resistors 126, 128 are included for operation with an output amplifier, to provide voltage spans of either 10 v. or 20 v.

An R-2R network 130 is used for the last group of switches 114. The transistors of this group operate at one-half the current level of the transistors of the other two groups. An additional transistor 132 is provided, matched to the 12th switch transistor 134, to properly terminate the R-2R network. Although there is a 2:1 emitter area mismatch between transistor 134 and the other switch transistors, the resulting differential-gain temperature coefficient is negligibly small since it is introduced at the least significant bit level.

The converter herein disclosed can be operated as a two-quadrant multiplier by varying the reference voltage 32 as one of the values to be multiplied, the other value being the digital input number. The magnitude of the reference voltage directly controls the magnitude of all of the bit currents correspondingly because the amplifier 26 sets the base voltage line 24 so that the bit currents track the reference current flowing through resistor 34. The bit currents are maintained at the correct values even at very low levels, as a result of the unique switching and voltage control arrangements described hereinabove, so that the converter performs quite accurately as a multiplier.

Although a specific preferred embodiment of the invention has been described hereinabove in detail, it is desired to note that this is for the purpose of illustrating the invention, and should not be construed as necessarily limiting of the invention, since it is apparent that those skilled in this art will be able to modify the form of the invention in many ways to meet the requirements of different applications.

I claim:

1. In an integrated-circuit digital-to-analog converter of the type having a plurality of transistors connected as constant-current generators with their emitters connected through resistors to a power supply line, and wherein the base voltages of said transistors, relative to the voltage of the remote ends of the respective emitter resistor, control the magnitude of the current passing therethrough;

switch means for such constant-current generator comprising:

a switch transistor;

means connecting the emitter of said switch transistor to the collector of the associated constant-current transistor;

means connecting the collector of said switch transistor to an output line through which said constant current is to be selectively directed by said switch transistor when the latter is rendered conductive;

control circuit means for supplying control voltage to said switch transistor to render that transistor conductive;

said control circuit means including means to apply a voltage to the base of said switch transistor;

current controlled bias-generating means coupled between the base of said constant-current generator transistor and a circuit point of said control circuit means, said control circuit means including means to establish a substantially fixed potential relationship between said circuit point and the base of said switch transistor while the latter is conducting, so as to maintain a substantially constant voltage differential between the bases of said two transistors while said switch transistor is conducting;

whereby the collector-to-base voltage of said constant-current transistor is maintained substantially invariant while said switch transistor is conducting; and means connected to the collector of said constant current source transistor to carry the current thereof when said switch transistor is not conducting, so that the current through said constant current transistor will flow continuously at its constant level regardless of whether or not said switch transistor is conducting.

2. Apparatus as claimed in claim 1, wherein said switch means includes a second switch transistor matched to said first switch transistor and interconnected therewith to form a differential switch pair, the emitters of said switch pair being connected together to the collector of said associated constant-current transistor; and means connecting the collector of said second switch transistor to a current return line;

whereby said differential pair is operable selectively to direct said constant current either to said output line or to said return line, in accordance with the operation of said control circuit means.

3. Apparatus as claimed in claim 2, wherein said control circuit means comprises fully-balanced input signal means for alternatively applying oppositely-symmetrical voltages to the bases of said two switch transistors, said bias-generating means serving to apply a common-mode voltage to the input circuit of both of said switch transistors.

4. Apparatus as claimed in claim 1, wherein all of said switch transistors are NPN type.

5. Apparatus as claimed in claim 1, wherein said control circuit means include a resistor connected between the base of said switch transistor and said circuit point; and means to produce a flow of current through said resistor to develop a predetermined voltage differential between the base of said switch transistor and said circuit point, thereby to cause conduction through said switch transistor.

6. Apparatus as claimed in claim 3, wherein said switch control means comprises first and second identical resistors connected between the base of a respective switch transistor and said circuit point; and means for producing flows of equal currents alternatively through said first and second identical resistors to cause conduction, alternatively, through said two switch transistors.

7. Apparatus as claimed in claim 6, wherein said bias-generating means comprises a plurality of series-connected diodes connected between said circuit point and the base of said constant current source; and means to supply a constant current alternatively to said first or second resistor in accordance with the logic level of an input signal.

* * * * *